United States Patent
Ramappa et al.

(10) Patent No.: US 7,601,629 B2
(45) Date of Patent: Oct. 13, 2009

(54) SEMICONDUCTIVE DEVICE FABRICATED USING SUBLIMING MATERIALS TO FORM INTERLEVEL DIELECTRICS

(75) Inventors: Deepak A. Ramappa, Dallas, TX (US); Richard L. Guldi, Dallas, TX (US); Asad Haider, Plano, TX (US); Frank Poag, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 160 days.

(21) Appl. No.: 11/312,926

(22) Filed: Dec. 20, 2005

(65) Prior Publication Data

US 2007/0141829 A1 Jun. 21, 2007

(51) Int. Cl.
*H01L 21/4763* (2006.01)
(52) U.S. Cl. ............... 438/619; 257/758; 257/E23.144
(58) Field of Classification Search ............... 438/623, 438/780, 781, 419; 216/73; 585/801; 257/758, 257/E23.144
See application file for complete search history.

(56) References Cited

U.S. PATENT DOCUMENTS

| | | | |
|---|---|---|---|
| 4,388,517 A | 6/1983 | Schulte et al. | |
| 5,597,768 A | 1/1997 | Passlack et al. | |
| 5,731,229 A | 3/1998 | Kato et al. | |
| 5,851,851 A | 12/1998 | Uenoyama et al. | |
| 5,895,272 A | 4/1999 | Li | |
| 6,025,222 A | 2/2000 | Kimura et al. | |
| 6,165,890 A * | 12/2000 | Kohl et al. | 438/619 |
| 6,682,999 B1 | 1/2004 | Mucha | |
| 6,927,158 B2 | 8/2005 | Aoyama et al. | |
| 2001/0019876 A1* | 9/2001 | Juengling et al. | 438/456 |
| 2004/0113189 A1 | 6/2004 | Takamatsu et al. | |
| 2005/0032995 A1 | 2/2005 | Kulkarni et al. | |
| 2005/0048765 A1* | 3/2005 | Kim | 438/623 |
| 2005/0194640 A1 | 9/2005 | Lazarev | |

FOREIGN PATENT DOCUMENTS

| | | |
|---|---|---|
| JP | 02-240947 | 9/1990 |
| JP | 05036895 | 2/1993 |

OTHER PUBLICATIONS

Bhusari et al. ("Fabrication of Air-Channel Structures for Microfluidic, Microelectromechanical, and Microelectronic Applications", Journal of Microelectromechanical and Microelectronic Applications, Journal of Microelectromechanical Systems, vol. 10, No. 3, p. 400, 2001.).*

* cited by examiner

*Primary Examiner*—W. David Coleman
*Assistant Examiner*—Sonya D McCall-Shepard
(74) *Attorney, Agent, or Firm*—Jacqueline J. Garner; Wade J. Brady, III; Frederick J. Telecky, Jr.

(57) ABSTRACT

The invention provides a method of fabricating a semiconductive device [200]. In this embodiment, the method comprises depositing a hydrocarbon layer [294] over a semiconductive substrate, forming an interconnect structure [295, 297] within the hydrocarbon layer [294], and removing the hydrocarbon layer [294] by sublimation.

16 Claims, 7 Drawing Sheets

SEMICONDUCTIVE DEVICE FABRICATED USING SUBLIMING MATERIALS TO FORM INTERLEVEL DIELECTRICS

TECHNICAL FIELD OF THE INVENTION

The invention is directed in general to a semiconductive device, and more specifically, to a semiconductive device fabricated by using subliming materials to form interlevel dielectric layers within the semiconductive device.

BACKGROUND

As semiconductive devices continue to shrink and component density rises, the conventional dielectrics that have been used in the past have begun to run into limitations. One such limitation is the dielectric capacitance that inherently exists within every semiconductive device due to the presence of the dielectric layers that electrically isolate interconnects and the transistors from each other. With device miniaturization, interconnect capacitive effects are becoming more prominent and problematic than before. This is due in part to the interconnect speed performance, which is directly proportional to the product of the dielectric capacitance and conducting metal resistance. Thus, with the continued miniaturization and increased densification of interconnects, the semiconductive industry is currently moving toward the use of low dielectric (low-k) materials to electrically insulate interconnects for semiconductive devices to reduce capacitive delays associated with the higher dielectric constant of silicon dioxide.

While the dielectrics presently being used by the semiconductive industry have dielectric constants less than that of silicon dioxide (i.e., less than about 4.0), it has been found that materials having lower and lower dielectric constants must be used with the progression to the next smaller node size. As a result, there is a constant struggle for semiconductive device manufacturers to find materials that will provide a lower dielectric constant with each new generation of node size.

Additionally, interconnect resistance has risen due to a decrease in interconnect line widths. Further, the increased interconnect line density has almost doubled the total length of metal lines present in these smaller devices. Moreover, in the past when metal lines were wider, the current transmission resided more within the center of the line, which has less resistance associated with it. However, as the line dimensions have shrunk, the electrical transmission now occupies nearly the entire dimension of the line, which enhances charge carrier scattering effects and, in turn, significantly increases total resistance. Both the added length and increased resistance at smaller line widths adds additional resistance to the device. The industry is presently struggling with how to best compensate for this increase in metal resistance. Since interconnect delays are related to the product of dielectric capacitance and metal resistance, the industry is looking for ways to decrease the interlevel dielectric capacitance as technology evolves into smaller devices.

Accordingly, what is needed in the art is a semiconductive device and method of manufacturing that device that provides the lowest interlevel dielectric capacitance possible.

SUMMARY OF INVENTION

To overcome the deficiencies in the prior art, the invention, in one embodiment, provides a method of fabricating a semiconductive device. In this embodiment, the method comprises depositing a hydrocarbon layer over a semiconductive substrate, forming an interconnect structure within the hydrocarbon layer, and removing the hydrocarbon layer by sublimation.

In another embodiment, a semiconductive device is provided that comprises a semiconductive substrate, semiconductive components located over the semiconductive substrate, and support structures located at different levels over the semiconductive components. The support structures have voids therebetween that form conduits between the support structures and between the different levels.

The foregoing has outlined examples of certain alternative embodiments and features of the invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures and equivalents thereof for carrying out the same purposes of the invention.

BRIEF DESCRIPTION OF THE DRAWINGS

The invention is best understood from the following detailed description when read with the accompanying FIGURES. Reference is now made to the following descriptions taken in conjunction with the accompanying drawings, in which.

DETAILED DESCRIPTION

Figure 1:
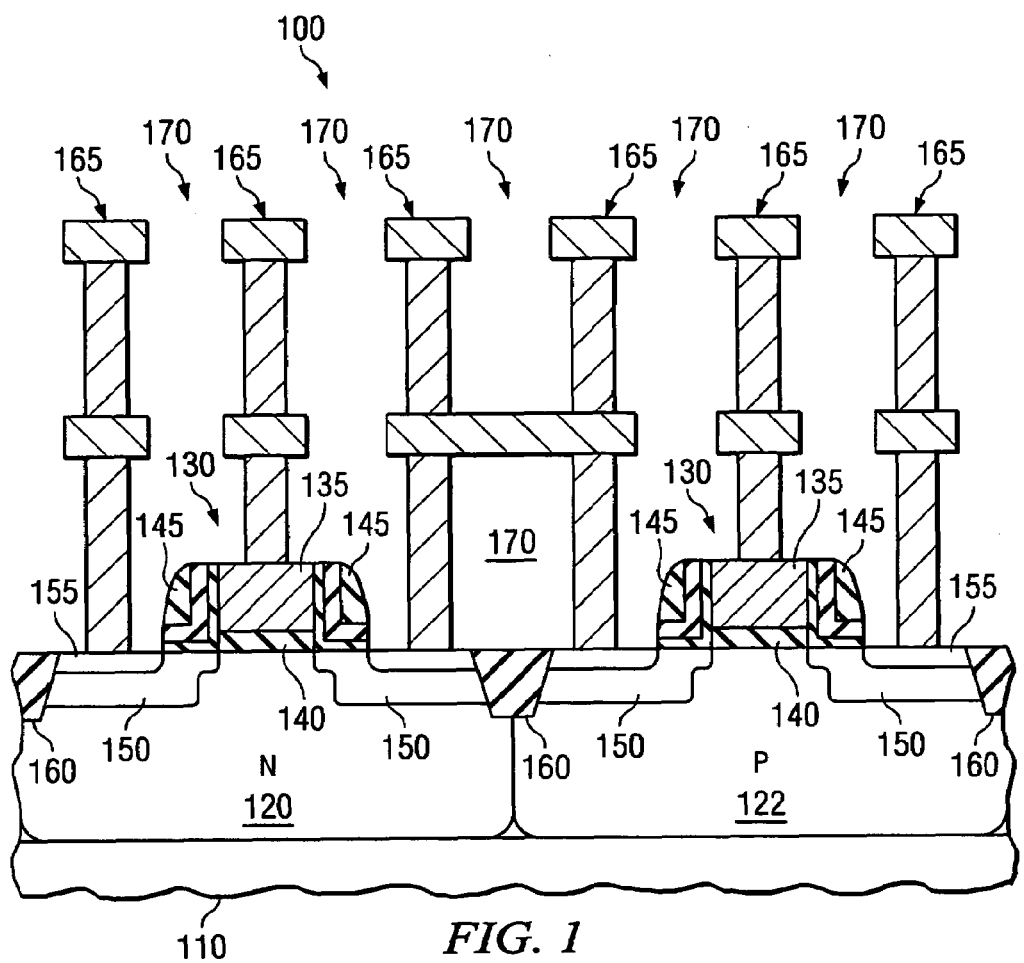
FIG. 1 illustrates a sectional view of one embodiment of a semiconductive device, as provided by the invention.

FIG. 1 illustrates a semiconductive device 100. While the embodiments illustrated herein are shown as integrated circuits, it should be understood that the invention is not limited to this but may include other semiconductive devices known to those skilled in the art, such as micro-electro-mechanical (MEM) devices or optical devices. The semiconductive device 100 includes a conventional substrate 110, such as a silicon wafer. Other semiconducting materials that are known to those skilled in the art may also be used in the invention. Located over the substrate 110 are conventional well regions 120 and 122 that may be located in the substrate 110 or may be located in a separately formed conventional epitaxial layer. In the illustrated embodiment, well region 120 is N doped and forms the well of a PMOS device, while well region 122 is P doped and forms the well of an NMOS device. Conventional transistors 130 that include gates 135 and a gate oxide 140 are located over the respective well regions 120 and 122. The transistors 130 further contain gate sidewall spacers 145 flanking both sides of the gates 135.

The transistors 130 of FIG. 1 additionally include conventional source/drains 150 located within the substrate well regions 120 and 122. Conventional source/drain contact pads 155, only two of which have been designated, are located within the source/drains 150. The source/drain contacts 155 may be silicided with a metal, such as nickel. However, other known silicidation materials could be used to form the silicided source/drain contacts 155 and remain within the scope of the invention. Conventional isolation structures 160 electrically isolate the transistors 130 from each other.

In addition, the semiconductive device 100 further includes interconnect structures 165 that are electrically isolated from each other by air, a vacuum, or another non-conductive gas, and they interconnect the transistors 130 to form an operative integrated circuit. This aspect presents an improvement over conventional devices in which solid dielectrics, such as silicon dioxide, fluorosilicate glass, organo silicate glass, polyamides, etc. are used to provide electrical isolation between the interconnects 165. Such conventional materials typically have dielectric constants that range from 3.0 to 4.0, which does not sufficiently reduced the parasitic capacitance for present technologies. Alternatively, in those embodiments where the semiconductive device 100 is sealed in a packaging material, the spaces or voids between the interconnects 165 may be filled with a non-conductive gas or may simply be placed under vacuum.

Because the invention utilizes hydrocarbon materials that can be removed by sublimation, the hydrocarbon material can easily be removed after the fabrication of the semiconductive device 100, thereby providing spaces or voids 170 between the interconnects 165 that can then be filled with air or other non-conductive gas, placed under a vacuum, or be used as conduits for other interconnectivity purposes. Due to the very low dielectric constant associated with the air, non-conductive material, or vacuum, the parasitic capacitance and resistance in the device are reduced. The reduction in these innate properties results in a much faster and more efficient operating semiconductive device.

Figure 2A:
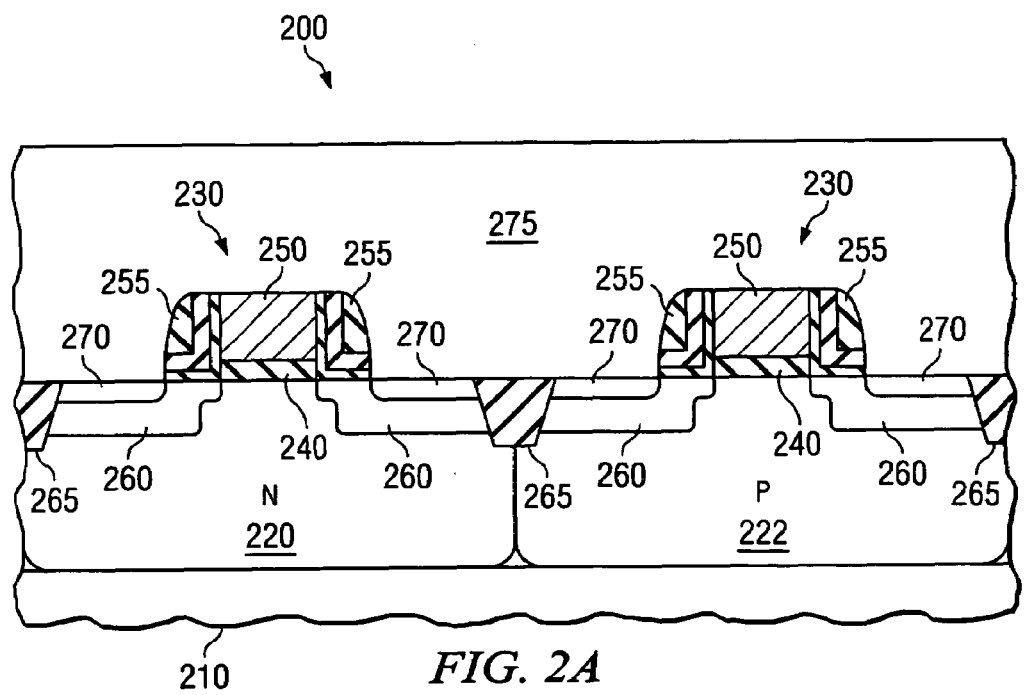
FIG. 2A illustrates a sectional view of a partially completed semiconductive device after the deposition of a hydrocarbon layer.

Turning now to FIGS. 2A-4B, illustrated are sectional views of detailed manufacturing steps instructing how one might, in one embodiment, manufacture a semiconductive device similar to the semiconductive device 100 depicted in FIG. 1. FIG. 2A illustrates a semiconductive device 200, which a conventional substrate 210. As mentioned above, the substrate 210 may, in one example, be any layer located in the semiconductor device 200, including a wafer itself or a layer located above the wafer (e.g., epitaxial layer). In the embodiment illustrated in FIG. 2A, the substrate 210 is a P-type substrate; however, one skilled in the art understands that the substrate 210 could be an N-type substrate. For clarity, no further reference to this opposite scheme will be discussed. The substrate may be any type of material known to those who are skilled in the art of manufacturing semiconductive devices, such as silicon, silicon germanium or gallium arsenide.

Located over the substrate 210 are complementary doped wells 220, 222. As seen in the illustrated embodiment, the well 220 may be doped to conventional concentration levels with an n-type dopant, while the well region 222 may be doped to conventional concentration levels with a p-type dopant.

Located over the substrate 210 are semiconductive components 230, such as conventional transistors. Other semiconductive components, such as inductors, resistors, mirrors, or capacitors are also within the scope of the invention. The transistors each include a gate oxide 240 and a gate electrode 250, which in a one embodiment, may be comprised of polysilicon, amorphous silicon, a silicided polysilicon, or in other embodiments a metal. The gate oxide 240 may comprise a number of different but well known materials. For example, the gate oxide 240 may comprise silicon dioxide, or in an alternative embodiment comprise a high dielectric constant (K) material. Any one of a plurality of well known manufacturing techniques could be used to form the gate oxide 240.

Conventional blanket deposition and patterning processes may be used to form the gate electrodes 250 and gate oxides 240, as well as sidewall spacers 255 that flank both sides of each of the gate electrodes 250. The gate sidewall spacers 255 may each include one or more different layers. For instance the gate sidewall spacers 255 may also include a nitride layer located between oxide layers. The gate sidewall spacers 255 may comprise many different types and numbers of layers while staying consistent with the principles of the invention. Source/drains 260 are conventionally formed and may include a conventional lightly doped drain (LDD) region that extends under the sidewall spacers 255, as generally shown. Conventionally formed isolation structures 265, such as trench isolation structures electrically isolate the source/drains 260 from each other to form the illustrated complementary device. The base semiconductive components 230 are completed with the conventional formation of silicided contact pads 270, only two of which are designated.

Located over the semiconductive components 230 is a hydrocarbon layer 275. The hydrocarbon layer 275 is comprised of a material that preferably has a sublimation temperature of less than about 300° C. In yet other embodiments, the hydrocarbon layer 275 may have a sublimation temperature of less than 100° C., and in other applications, the sublimation temperature occurs at room temperature, or about 22° C. to 23° C. The type of hydrocarbon used may vary. However, in certain embodiments, the hydrocarbon layer 275 is comprised of a cyclic compound, and more preferably, the cyclic compounds are aromatic cyclic compounds. Furthermore, in some embodiments, the hydrocarbons are hydrophobic and thus not affected by water during cleaning and etching processes. Non-limiting examples of such cyclic compounds include camphene, naphthalene, camphor, toluene, bromonitrobenzene, or various combinations thereof Examples of the combinations may include camphene-camphor compounds or eutectic systems, such as camphor-naphthalene-anthracene. Other examples of materials that can be used to form the hydrocarbon layer 275 are discussed below.

In certain embodiments, the hydrocarbon materials are selected to have sublimation points slightly greater than or below the temperatures or thermal budgets used in the back-end processing (e.g., metal interconnect formation). As device sizes continue to shrink, the temperatures at which semiconductive devices are fabricated have decreased over the last few node generations. The decrease in process temperature stems from the fact that the extremely small scales device components are highly susceptible to degradation when subjected to higher process temperatures. Thus, the industry has sought ways to decrease back-end process temperatures. It should be understood that materials having sublimation points above the thermal process budgets discussed above are also within the scope of the invention.

The hydrocarbon layer 275 may be deposited by using spin coating techniques similar to those used to apply organo silicate glass or photoresist materials. Alternatively, deposition process such as chemical vapor deposition (CVD) or physical vapor deposition (PVD) processes may also be used. Thus, PVD, CVD, spin coating, or any other suitable technique can be used to deposit the hydrocarbon layer 275. However, CVD and spin coating techniques are particularly useful because they provide good control for density or uniformity.

In the spin coating technique, the hydrocarbon used to form the hydrocarbon layer 275 can be polymerized into a compound that solidifies with time or dissolved in a solvent. The spin coating is preferably conducted at relative lower rotational speeds, e.g., less than about 1000 rpm, depending on the viscous nature of the hydrocarbon being used. The spin coating can also involve an application of an adhesion layer (not shown) below the hydrocarbon layer 275. The adhesion layer can also be spun coated on top of any underlying layers, such as etch stop layers. The hydrocarbon layer 275 typically has a thickness ranging from about 10 nm to about 12 nm and in one embodiment comprises a single silicon bond and unsaturated organic segment containing chemicals, such as vinyltriacetoxysilane, which are commercially available.

In certain embodiments, prior to the deposition of the hydrocarbon layer 275, a pre-wetting solvent, such as 1,3,5-trimethyl benzene (mesitylene) or propylene glycol monomethyl ether acetate (PGMEA) may be spun coated over the substrate 210 for a brief 1-2 seconds. The substrate 210 is accelerated to about 2000 rpm to remove excess solvent and then the hydrocarbon is spun coated at around 1000 rpm at preferably about room temperatures (e.g., about 20 to 30° C.).

In another embodiment, the hydrocarbon layer 275 could be deposited using a low temperature sputtering process, which can be conducted at temperatures less than about 100° C. Co-deposition and/or CVD deposition processes may also be used. Because of the fact that the hydrocarbon layer 275 is deposited as an interlevel dielectric 'blanket' film in the dual damascene scheme, there is no need for a sophisticated CVD process. Thus, processing can be simplified.

For a sputtering process the temperature is maintained below about 50° C. and deposited preferably at a pressure of about 0.1 mT. For CVD processes, precursors for organic polymers can be dissociated in a fashion similar to those used for oxide dielectric materials. A precursor can be volatilized and dissociated to form reactive intermediates in a dissociation chamber, typically using heat generated by a resistive heater, and the reactive intermediates can then be transferred to the deposition chamber. Organic polymers can be selected to have threshold polymerization temperatures. The threshold temperature is defined herein to mean the temperature above which the growth rate of the polymer is approximately zero. It should be further understood, however, that the threshold temperature can be a function of the molecular weight and molecular structure of the polymer.

Examples of suitable polymers that can be used to form the hydrocarbon layer 275 include poly(para-xylylenes). Poly (para-xylylenes) may be typically deposited from dimers using well known processes, such as the one disclosed in U.S. Pat. No. 3,342,754, which is incorporated herein by reference. Poly(para-xylylenes) include poly(chloro-p-xylylene) (PPXC), poly(dichloro-p-xylylene (PPXDC), or poly(tetrafluoro para-xylylene) (PTFPX). Other examples include, poly(dimethoxy-para-xylylene), poly(sulfo-para-xylylene), poly(iodo-para-xylylene), poly (.alpha., .alpha., .alpha.', .alpha.', tetrafluoro-para-xylylene), poly(trifluoro-para-xylylene), poly(difluoro-para-xylylene), or poly(fluoro-para-xylylene). However, it should be understood that any poly (para-xylylene) polymer could be used. Examples of other poly(para-xylylenes) are set forth in Salome, Polymeric Materials Encyclopedia, CRC Press, Boca Raton, Fla. (1996). Further, poly(N-phenyl-maleimide) can also be used.

Additionally, in certain embodiments, the formation of the hydrocarbon layer 275 may comprise organic phases that include organic phase copolymers. In such embodiments, the following materials are suitable: poly(maleimide/parylene) copolymer, poly acenaphthalene/parylene copolymer, divinylbenzene/parylene copolymer, perfluoro-octylmethacrylate (PFOMA)/parylene copolymer, or 4-vinyl biphenyl/parylene copolymer. Other examples include, 9-vinylanthracene/parylene copolymer, maleic anhydride/parylene copolymer, N-vinyl pyrrolidone/parylene copolymer, 4-vinylpyridine/parylene copolymer, styrene/parylene copolymer, Buckminster-fullerene/parylene copolymer, or trihydroperfluoroundecylmeth-acrylate/parylenecopolymer.

Additionally, cross-linked organic phase copolymers can be used to manufacture the organic phase of nanocomposites. In such embodiment, the following are useful: 2,3,5,7, tetravinyl, 1,3,5,7, tetramethylcyclotetrasiloxane/parylene; 1,3, 5, trivinyl, 1,3,5, trimethylcyclotrisiloxane/parylene, tetravinylsilane/parylene/parylene, or 1,1,3,3, tetravinyldimethyldisiloxane/parylene.

Following the deposition and hardening, and if so required, the hydrocarbon layer 275 can be planarized using conventional chemical/mechanical polishing (CMP) processes that are known to those who are skilled in the art.

The use of the hydrocarbon layer 275 provides process advantages over conventional dielectrics. For example, in conventional processes, during the etching and cleaning process, care must be taken to reduce damage to the surface of the dielectric layers as much as possible. Additionally, etch stop layers are deposited to protect the underlying dielectric layers from damage associated with fabrication process. Each of these steps requires additional time and effort during the process of the semiconductive device. In the invention, however, since the hydrocarbon layer 275 will be completely removed by sublimation, the added care and etch stop layers required by conventional processes may not be necessary. Thus, both manufacturing time and costs can be reduced.

2B illustrates the semiconductive device 200 of FIG. 2A after masking the hydrocarbon layer 275. Conventional processes, such as photolithographic processes can be used to form a pattern 280 on the hydrocarbon layer 275. Such processes may include the deposition of a photoresist layer that is conventionally patterned with a photolithographic process. Alternatively, portions of the hydrocarbon layer 275 can be implanted through a reticle or photomask with a dopant, such as boron or phosphorous. The dopants make the doped portions of the hydrocarbon layer 275 more susceptible to etchants that can be used to remove the undoped portions. In yet another embodiment, the hydrocarbon layer 275 can be doped to make the desired portions photosensitive, which can then be exposed to photons and be removed with the appropriate etchant. Examples of such dopants include silicon carbide (SiC), silicon nitride (SiN), or carbon.

Figure 2B:
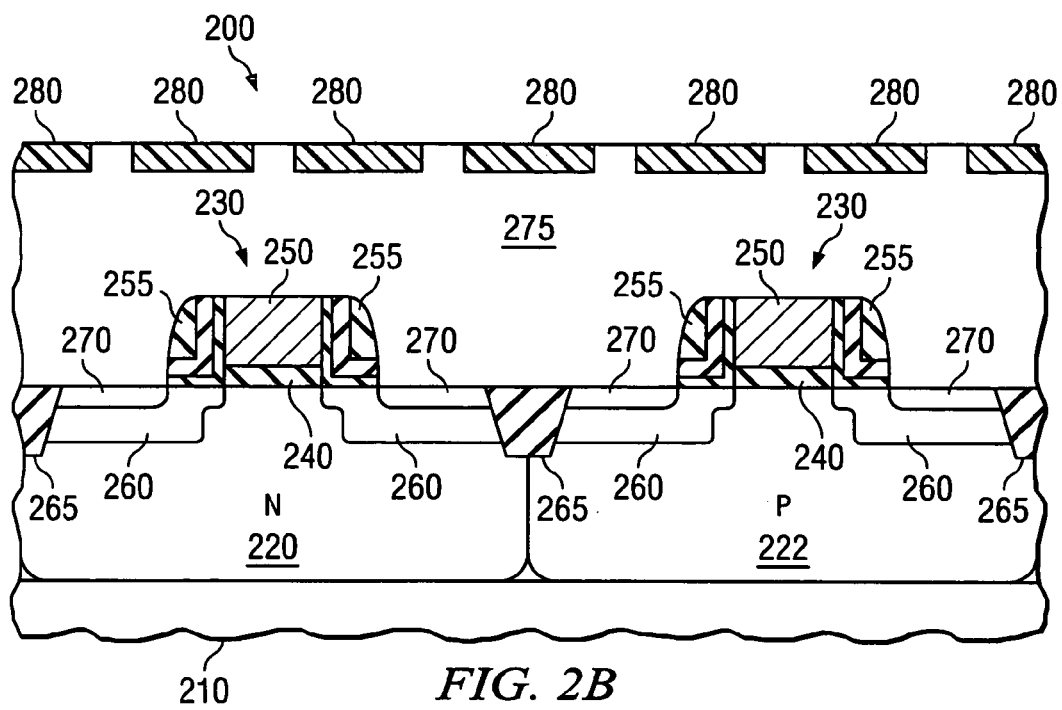
FIG. 2B illustrates a sectional view of the semiconductive device illustrated in FIG. 2A after masking the hydrocarbon layer.
Figure 2C:
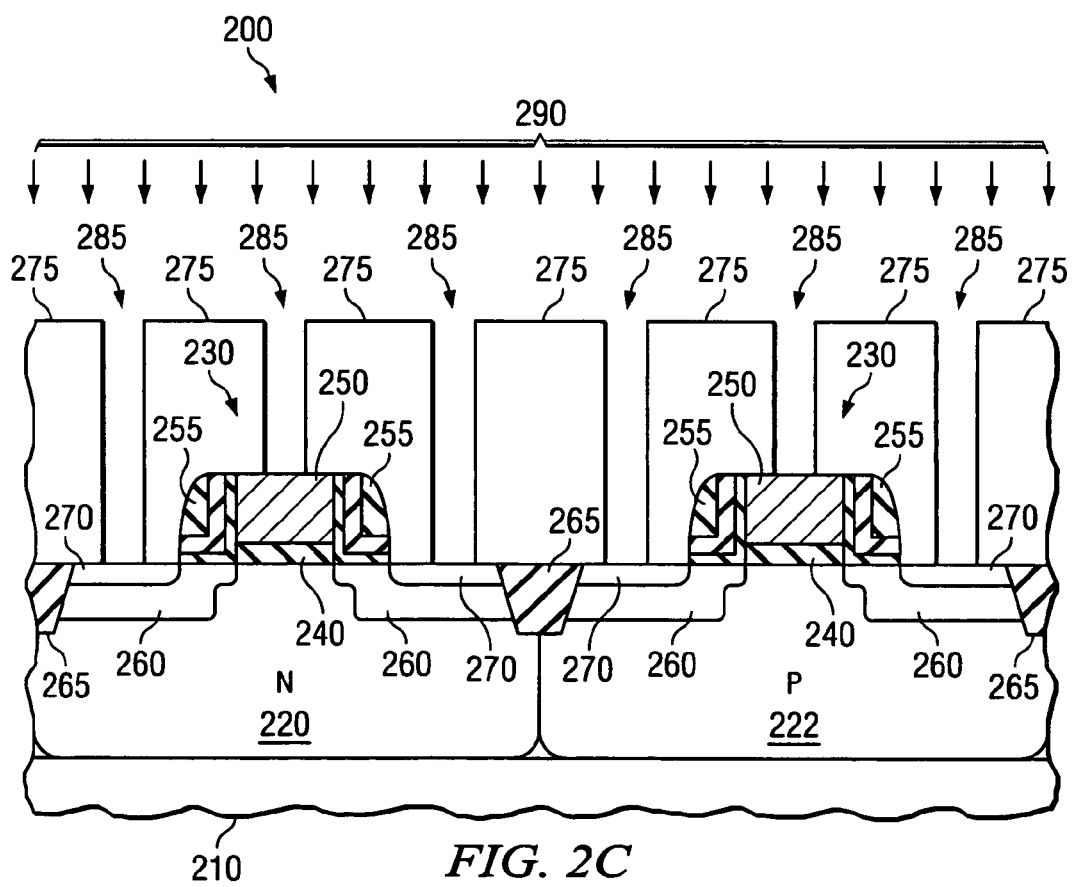
FIG. 2C illustrates a sectional view of the semiconductive device illustrated in FIG. 2B after patterning the hydrocarbon layer.

FIG. 2C illustrates the semiconductive device 200 of FIG. 2B after the patterning and formation of openings 285 in the hydrocarbon layer 275. Following the patterning of the hydrocarbon layer 275, as discussed above, an etching process, indicated by arrows 290, can be used to form the openings 285. In one embodiment, the etching process 290 may be a conventional plasma etch, including gases such as fluorine, chlorine, trifluoro methane ($CHF_3$), carbon tetrafluoride ($CF_4$), or ammonia ($NH_3$) in combination with oxygen or inert gases like argon or helium. The plasma etch may be conducted using conventional parameters.

Alternatively, the etching process 290 may be a wet etch. In such embodiments commercially available solvents such as polyoxyethylene-octyl-phenyl ether or octylphenol ethoxylate, fatty alcohol ethoxylate, or sodium dodecyl sulphate may be used and can be combined with surfactants to enhance the etch of the hydrocarbon layer 275. After the openings 285 are formed, the semiconductive device 200 would then be subjected to a conventional clean process, such as a conventional wet clean process.

Figure 2D:
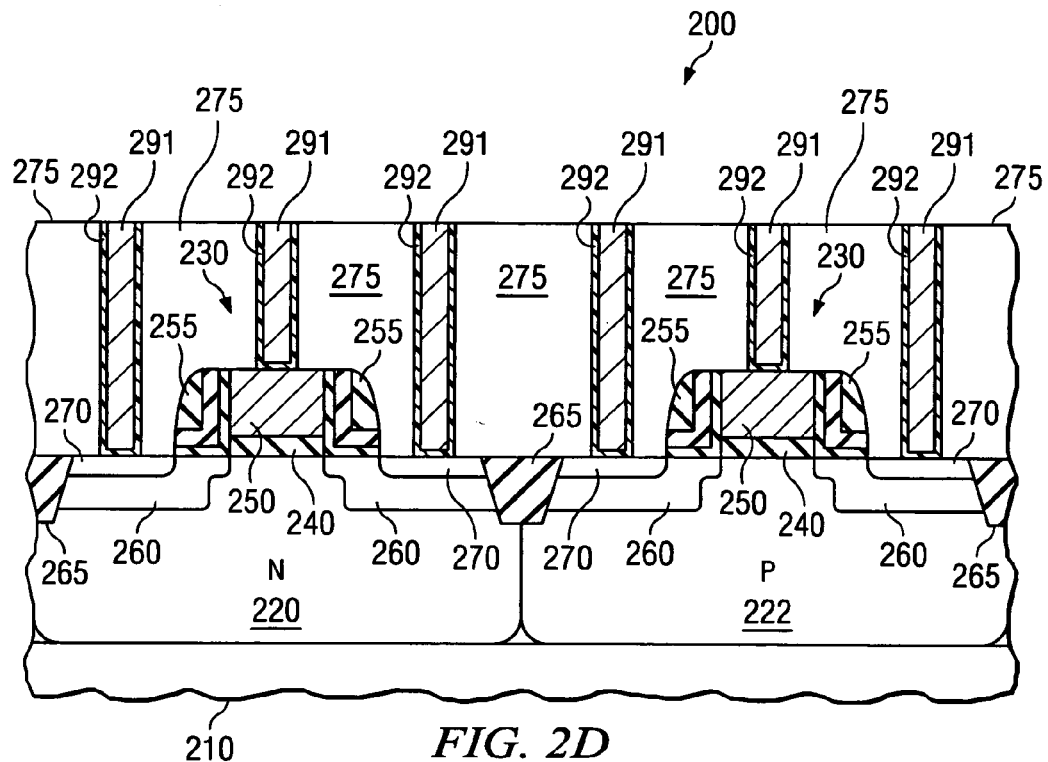
FIG. 2D illustrates a sectional view of the semiconductive device illustrated in FIG. 2C after the formation of interconnect structures that include support liners or metal diffusion material in the patterned hydrocarbon layer.

FIG. 2D illustrates the semiconductive device 200 of FIG. 2C after the formation of support structures 291, including optional support liners 292 located at a first level. In the illustrated embodiment, the support structures 291 are conventional interconnects that provide electrical connection in addition to providing a support component. However, in other embodiments, the support structures 291 may provide only a support function. While the support liners 292 are shown in this embodiment, other embodiments may not include the support liners 292. Following the clean-up of the openings 285 (FIG. 2C), a support liner 292 layer is conventionally deposited within the openings 285, after which a conductive metal, such as copper, aluminum, other conductive metal, or alloys thereof, is conventionally deposited within the openings 285 and over the support liner 292 to form the support structures 291. The support liner 292 may be comprised of the same material used to form conventional barrier layers. A conventional planarization process is conducted to remove the excess metals from the surface of the hydrocarbon layer 275, resulting in the semiconductive device 200 shown in FIG. 2D.

Unlike the barrier layers of conventional semiconductive devices, the support liners 292, when present, provide substantial structural support for the support structures 291 upon the sublimation of the hydrocarbon layer 275. In other words, in conventional devices, the barrier layer is typically used to prevent diffusion between interconnects and the surrounding dielectric layer, and its support component is minimal in view of the fact that the interconnect is largely supported by the dielectric layer over which and in which the interconnect is formed. However, in the invention, each support liner 292 serves to substantially support its respective support structure 291 and diffusion in not an issue, inasmuch as the hydrocarbon layer 275 is removed by sublimation and is not present to lend support to the support structure 291.

Moreover, in conventional devices, the barrier layer needs to be selected for its adhesion and diffusion barrier properties. In contrast, the invention allows for the use of much stronger metals, such as iridium. It should be understood, however, that more conventional barrier layer metals or alloys, such as tantalum, ruthenium, titanium, or lanthanum can be used as the support liner 292 in the invention.

Figure 2E:
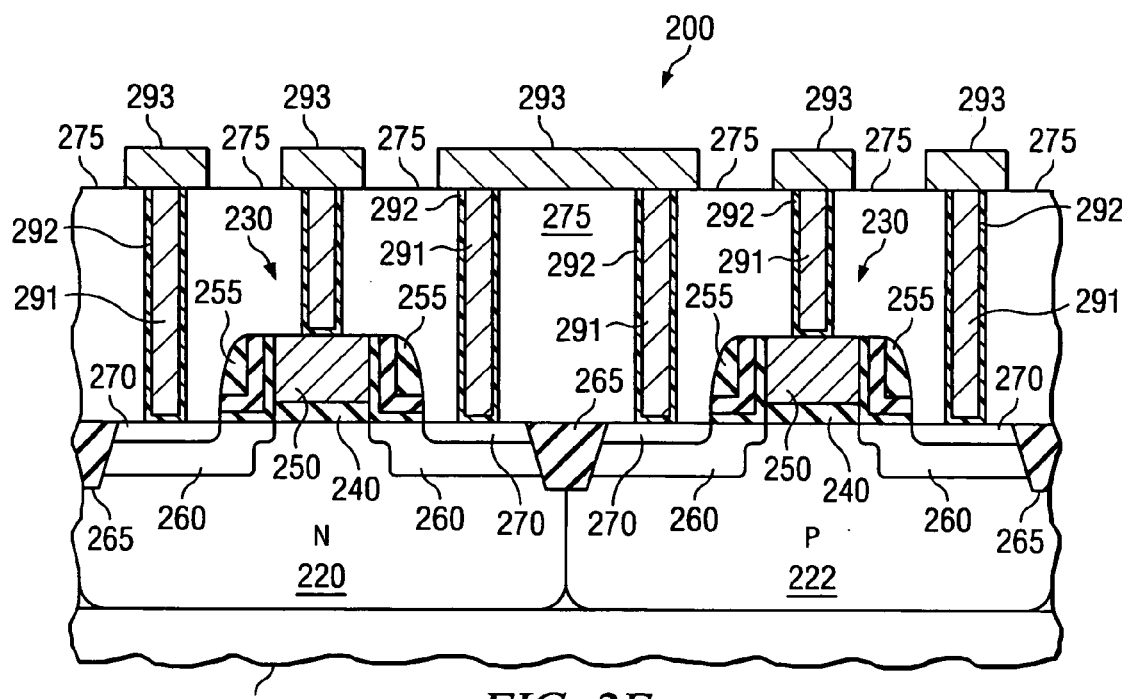
FIG. 2E illustrates a sectional view of the semiconductive device illustrated in FIG. 2D after the deposition and patterning of a metal layer over the hydrocarbon layer to form metal lines.

FIG. 2E illustrates the semiconductive device 200 of FIG. 2D following the conventional deposition and patterning of an optional first metal layer that forms separate metal lines 293. The metal lines 293 contact different support structures 291 and can form a portion of the overall support structure 291. The metal used to form the metal lines 293 may comprise conventional metals, such as copper, aluminum, or alloys thereof. The metal lines 293 may be located on top of the hydrocarbon layer 275; however, the invention is certainly applicable to those processes that implement conventional damascene techniques where the metal lines 293 are formed within the hydrocarbon layer 275. For example, when a damascene scheme is used, interconnect openings can be etched into the hydrocarbon material 275 and then filled with metal and planarized.

Figure 2F:
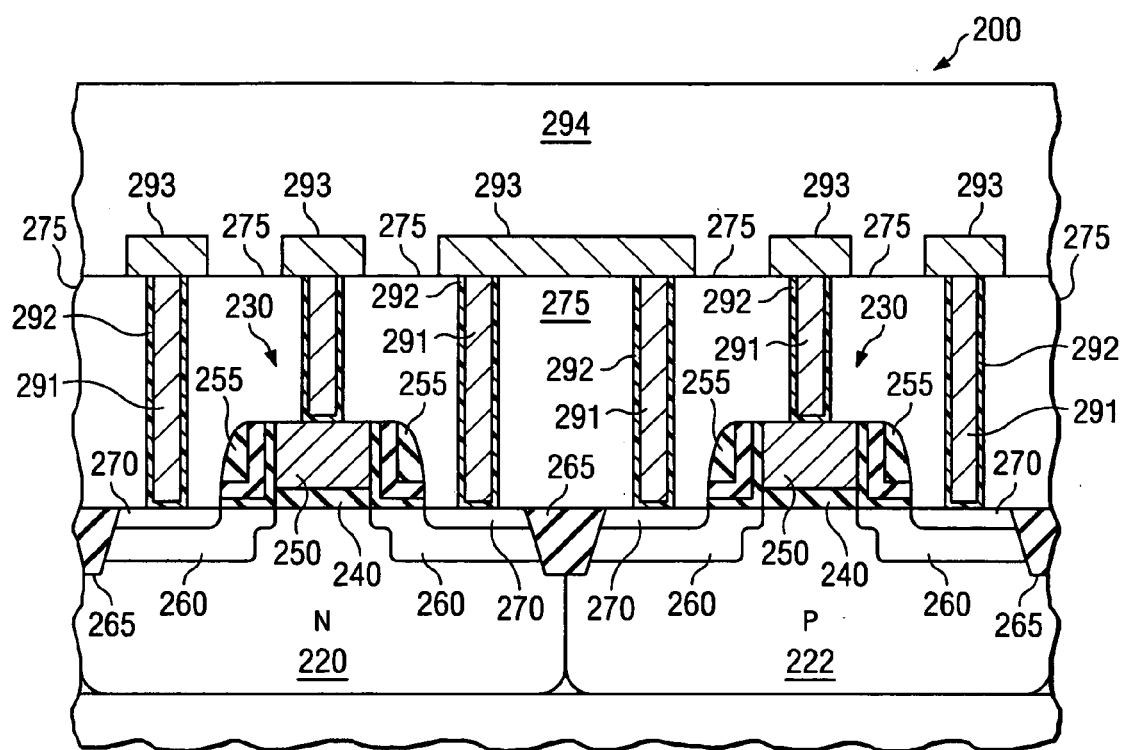
FIG. 2F illustrates a sectional view of the semiconductive device illustrated in FIG. 2E after the deposition of a second hydrocarbon layer over the metal lines.

FIG. 2F illustrates the semiconductive device 200 of FIG. 2E after the deposition of a second hydrocarbon layer 294. The second hydrocarbon layer 294 may be deposited in the same manner as the hydrocarbon layer 275 and may comprise the same type of hydrocarbon material. However, the invention does not require that hydrocarbon layers 275 and 294 have identical chemical compositions. In those embodiments where they do have different compositions, they may have sublimation temperatures that are less than the back-end thermal budget of the semiconductive device, for example about 300° C. or less.

Figure 2G:
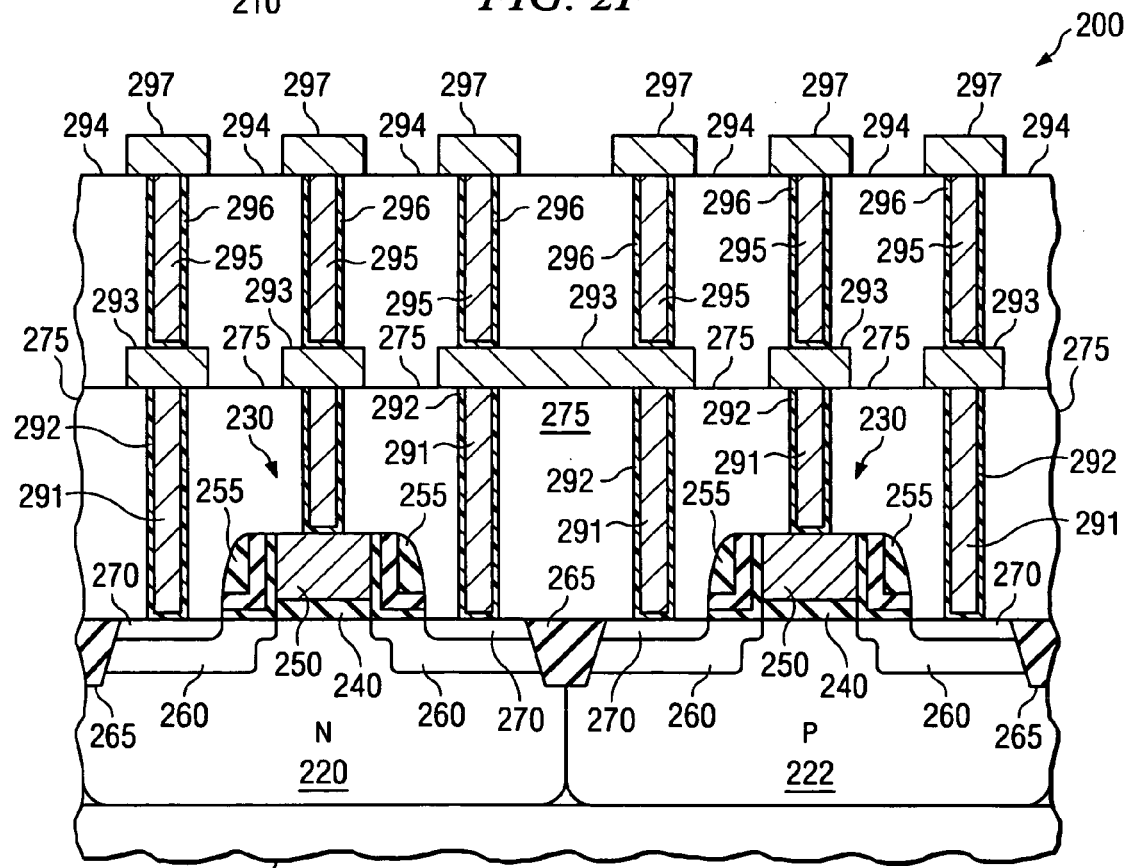
FIG. 2G illustrates a sectional view of the semiconductive device illustrated in FIG. 2F after patterning a second hydrocarbon layer, forming additional interconnects in the patterned second hydrocarbon layer and forming a second metal line over the second hydrocarbon layer.

FIG. 2G illustrates the semiconductive device 200 of FIG. 2F after the formation of additional support structures 295 and 297 and support liners 296 located at other levels within the semiconductive device 200. The process discussed above may be used to form the second layer of support structures 295 and 297 and support liners 296. This second level is given for illustrative purposes only and those who are skilled in the art understand that the above described processes could be repeated for any number of metal levels, as required by design.

Figure 3:
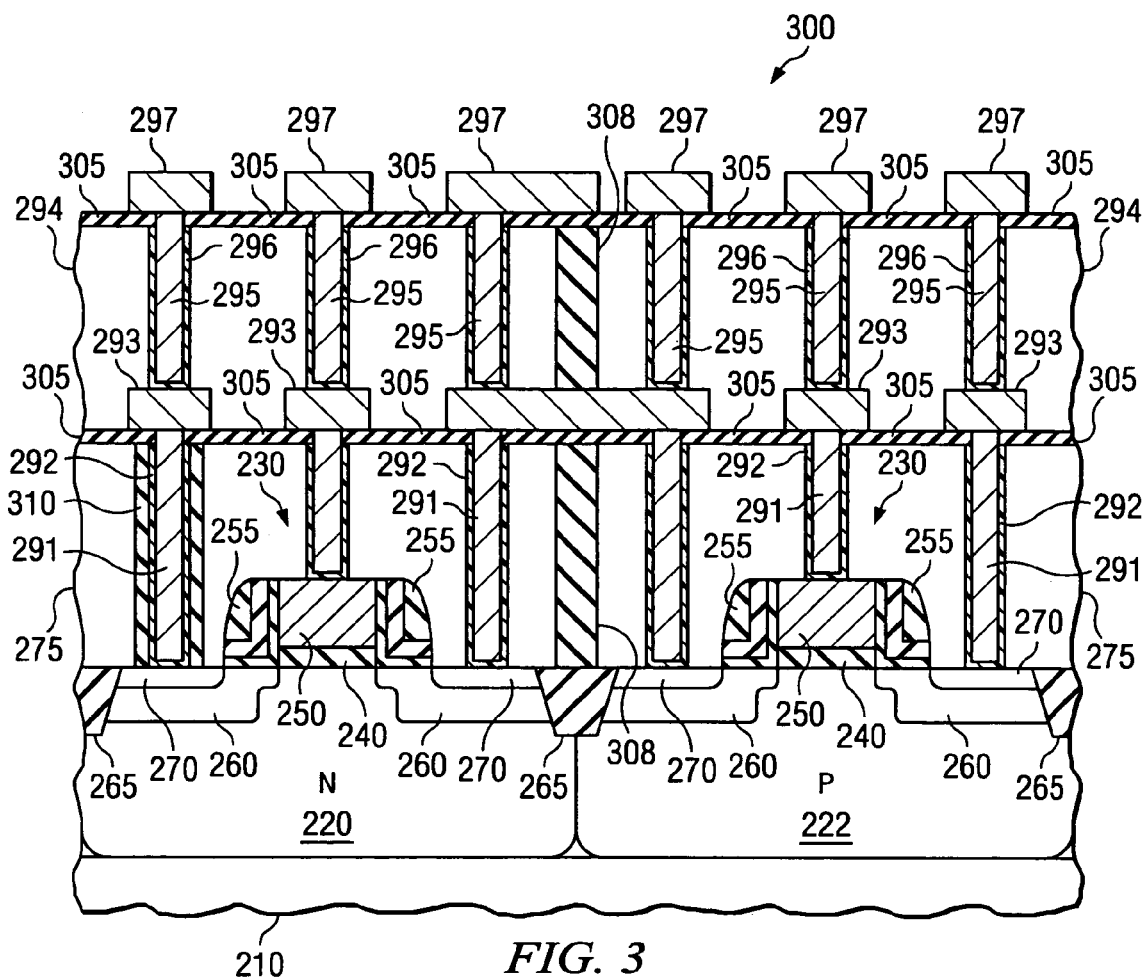
FIG. 3 illustrates a sectional view of an alternative embodiment of a semiconductive device illustrating embodiments of interconnect support structures.

FIG. 3 illustrates another embodiment of the invention. In this embodiment, the semiconductive device 300 includes a support structure layer 305 and a support column 308 in addition to the support liners 292 and 296. The support structures 305 or 308 may be comprised of a conventional non-volatile, low-k material, such as silicon dioxide, fluorosilicate glass, silicon oxide doped with hydrogen, organ silicate glass, etc., that is deposited over or located within each of the hydrocarbon layers 275, 294. In certain embodiments, only one of the support structure layers 305 and support columns 308 may be present, while in other embodiments, both of these structures may be present. In alternative embodiments, either one or both of these structures may be present in addition to the above-discussed support liners 292 and 296.

Another embodiment provides for an additional support structure 310, only one of which has been shown for simplicity, located around the support liner 292. The support structure 310 may be comprised of the same conventional low-k dielectric materials just discussed above. In those embodiments where the support structure 310 is present, it may be formed by making the openings large enough to accommodate the support structure 291, the support liner 292 and the support structure 310 and using conventional deposition processes to deposit the support structure 310 in the opening prior to the formation of the support liner 292 and the support structure 291. However, prior to the deposition of the support liner 292, the portion of the low-k dielectric material located on the bottom of the opening would have to be removed so that electrical contact could be made.

In one embodiment, the support structure layer 305 is deposited on each level following the formation and planarization of support structures 291 and 295 and the support liners 292 and 296 when present. An opening is then patterned in the support structures 305, after which, the metal lines 293 and 297 are deposited and patterned to make contact with the respective support structures 291 and 295. As seen from FIG. 3, the metal lines 293 and 297 are primarily supported by the support structure layers 305, which in turn, are supported by the support liners 292, 296. Thus, the support structure layers 305 provide additional structural support to the metal lines 293 and 297. In yet another embodiment, support columns 308 may be formed at the same time as support structures 291 and 295. In such embodiments, the support columns 308 may be built over the electrically isolated region 265 so that they minimally affect the performance of the device.

FIG. 3 also illustrates how support columns 308 can be used to provide additional support to metal layers 293 and 297. The support columns 308 are preferably comprised of the same non-conductive, low-k material as used to fabricate the support layers 305. The support columns 308 are particularly useful in those instances where the metal layers 293 and 297 have a longer length, as shown. The positioning of the columns 308, as shown, are for illustrative purposes only and may be placed in various locations within the semiconductive device 300 as design parameters allow. Similar process as those used to construct the support structures 291 and 295 may be used to form the support columns 308. For example, openings would first be formed in the hydrocarbon layers 275, 294, after which the material would be deposited by way of known chemical vapor deposition or physical vapor deposition processes. In one example, the support columns 308 are formed after the support structures 291 and 295 are formed. However, in other embodiments, they may be formed prior to the formation of the support structures 291 and 295.

Following the deposition of the selected material into the openings, a planarization process would then be conducted to remove the excess material and thereby complete the formation of the support column 308. As previously mentioned, while FIG. 3 shows the presence of both types of support structures 305 and 308, this is done for illustrative purposes only and in other embodiments only one of such structures may be present. For example, the semiconductive device 300 may be constructed in such a way so as to have only the support columns 308 present and not the support liners 292, 296 or the support layers 305.

Figure 4A:
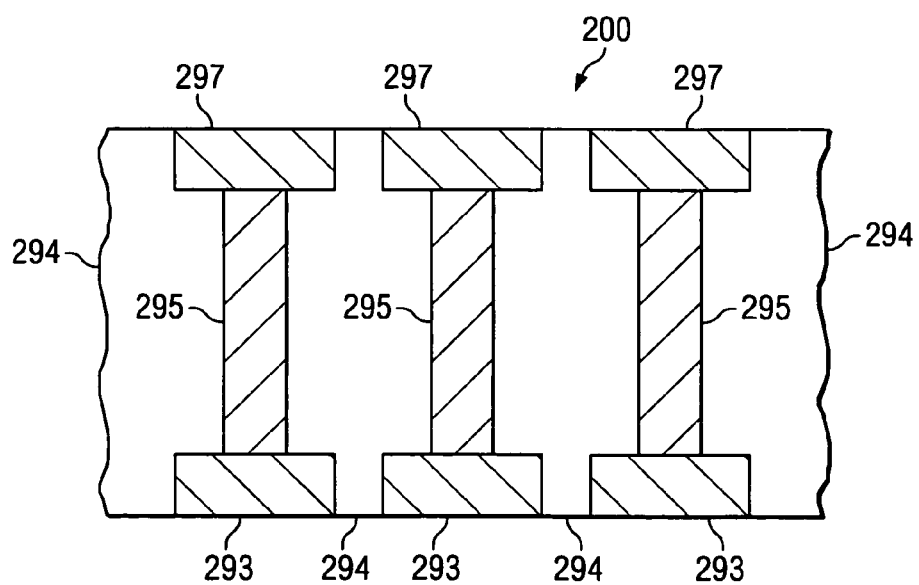
FIG. 4A illustrates an enlarged sectional view of a portion of the interconnects located in the semiconductive device of FIG. 2G.
Figure 4B:
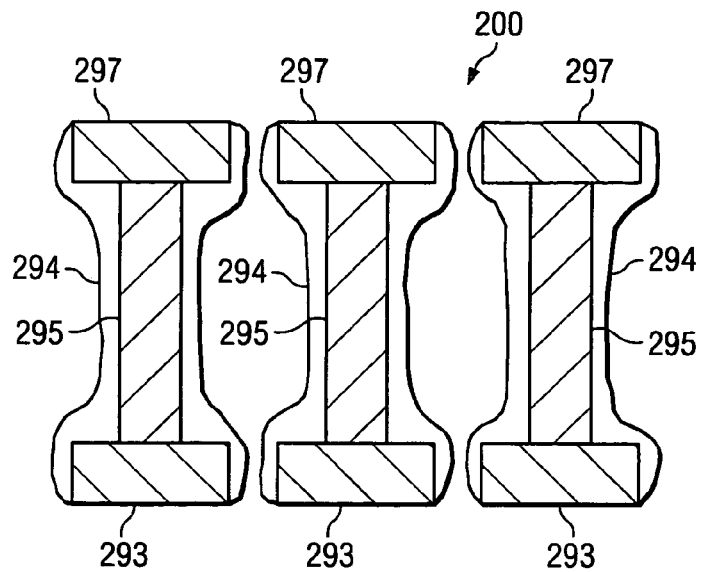
FIG. 4B illustrates an enlarged sectional view of the interconnects of FIG. 4A following partial sublimation of the hydrocarbon layer.

FIG. 4A illustrates an enlarged sectional view of the second level of support structures 295 and metal lines 293 and 297 of the semiconductive device 200 shown in FIG. 2G prior to sublimation of the hydrocarbon layer 294. FIG. 4B, shows the same view of the semiconductive device 200 after partial sublimation has been conducted. The sublimation process can be conducted following the completion of all levels within the semiconductive device 200, and it may be conducted in several ways. For example, the hydrocarbon material may be selected such that it sublimates at room temperature of about 22° C. to about 30° C. Alternately, the hydrocarbon material may be selected such that it sublimates when subjected to higher temperatures, such as, about 250° C., about 280° C., or about 300° C., or higher. Further, the pressure conditions may be changed to lower the atmospheric pressure to cause the sublimation to occur at a reduced temperature or at an accelerated rate. Additionally, the sublimation rate may be accelerated with the implementation of high energy light incidence. It should be noted that the sublimation rates can also be modulated or controlled by combining different hydrocarbon compounds or by forming eutectic systems that include the hydrocarbons or by the simultaneous use of a combination of several hydrocarbon materials.

Figure 5:
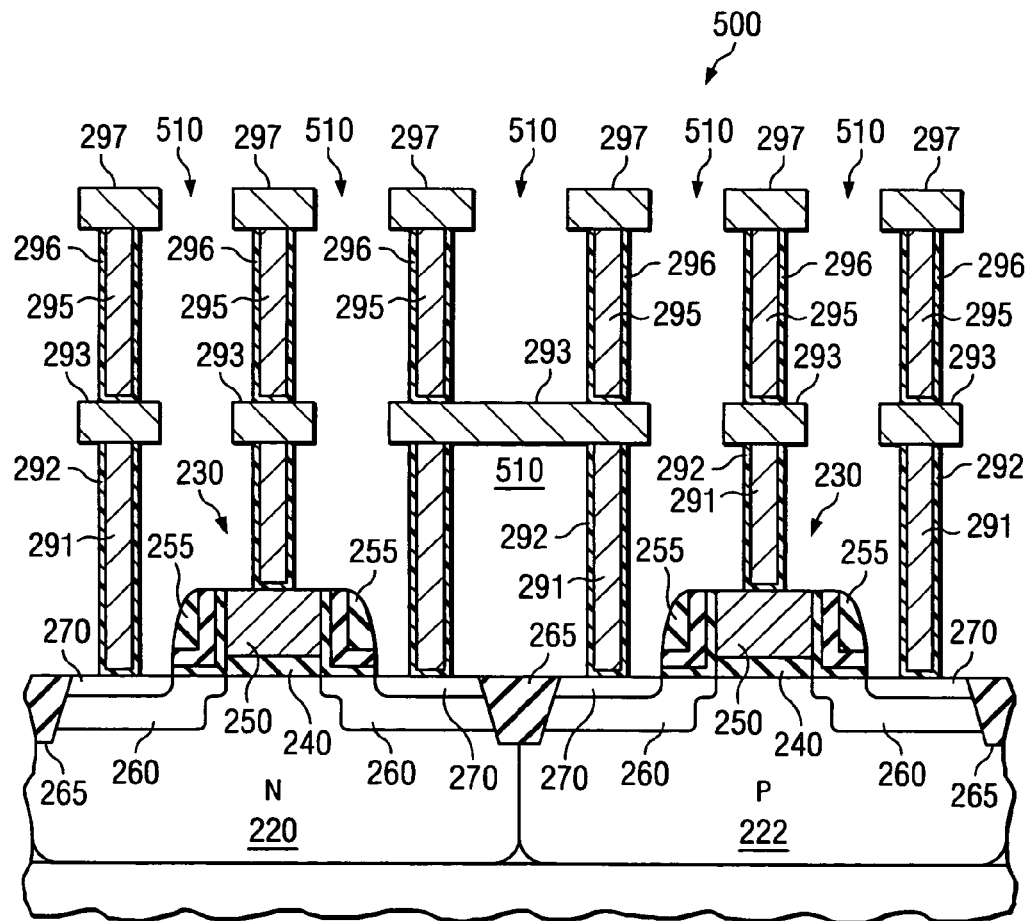
FIG. 5 illustrates a sectional view of the semiconductive device illustrated in FIG. 2G after the removal of the hydrocarbon layers by sublimation.

In another embodiment, the hydrocarbon material may be selected such that it sublimates when subjected to a chemical that expedites the sublimation process, such as an ambient of nitrogen or ammonia. The sublimation can be conducted or allowed to proceed until the hydrocarbon material at all levels has substantially, if not completely, sublimated. The substantial sublimation leaves voids 510 between the interconnects structures that can be occupied by a gas, such as air, a non-conductive gas, or even placed under a vacuum, as shown in the semiconductive device 500 shown in FIG. 5. Further, in some embodiments, the voids 510 can be used as conduits or channels for other interconnectivity purposes.

Figure 6:
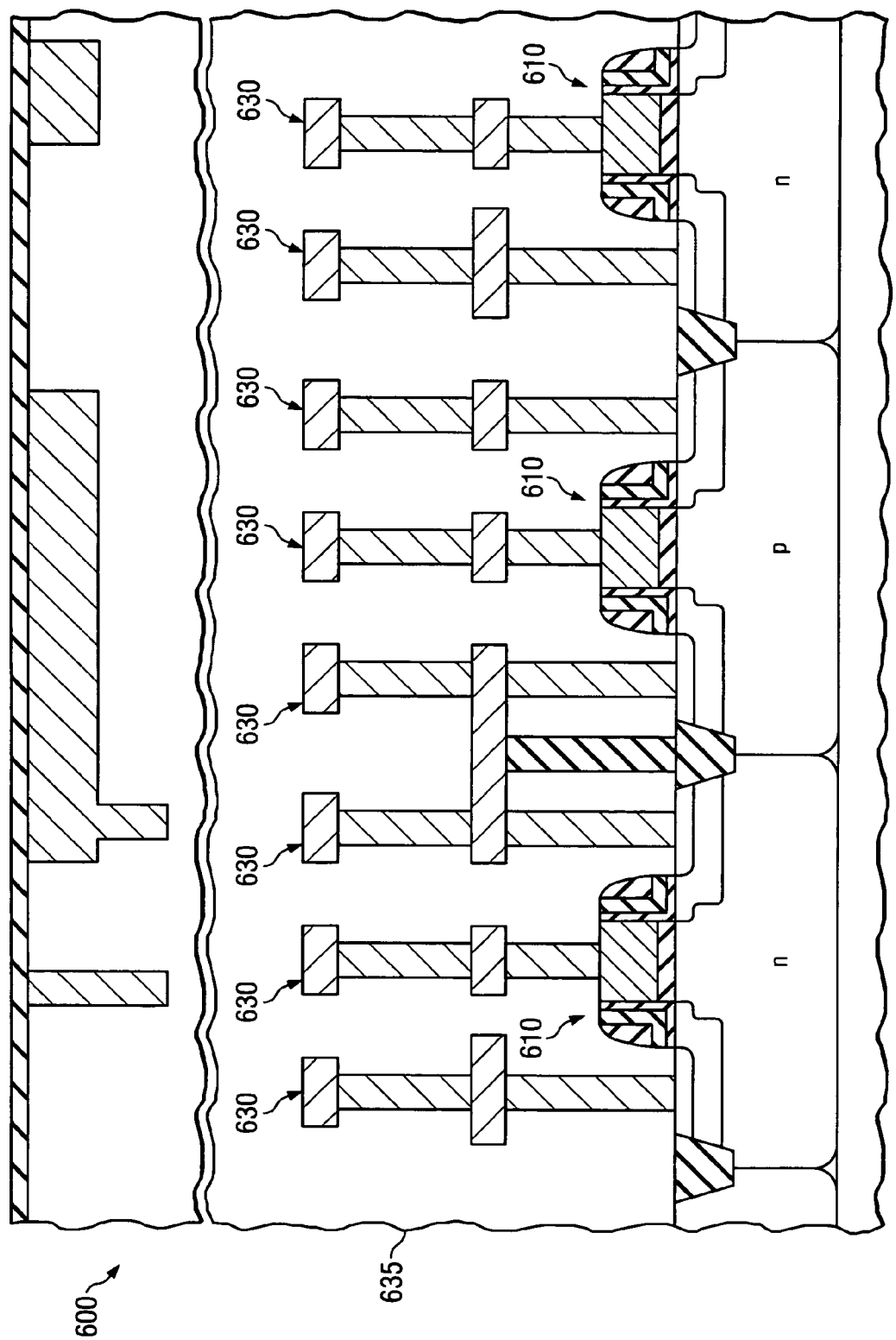
FIG. 6 illustrates a sectional view of an integrated circuit (IC) incorporating devices constructed according to the principles of the invention.

FIG. 6 illustrates the semiconductive device discussed above configured as an integrated circuit (IC) 600 that incorporates transistors 610 and interconnects 630. The transistors 610 may be configured into a wide variety of semiconductive devices, such as CMOS devices, BiCMOS devices, Bipolar devices, as well as capacitors or other types of devices. The IC 600 may further include passive devices, such as inductors or resistors, or it may also include optical devices or optoelectronic devices. Those skilled in the art are familiar with these various types of devices and their manufacture. In the embodiment illustrated in FIG. 6, the transistors 610 include the various components as discussed above. Interconnect structures 630, as those discussed above, electrically connect the transistors 610 to form an operative IC. It should be noted that while the structural components discussed above are not shown here for simplicity, they certainly can form a portion of the IC. Additionally, in as much as the hydrocarbon layers have been removed by sublimation, voids 635, versus conventional dielectric layers, are located between the interconnect structures 630. As explained above, these voids 635 can be filled with air, a non-conductive gas or have a vacuum created therein. With air or some other non-conductive gas or a vacuum existing between the interconnects 630, the dielectric constant of the interlevel voids is significantly reduced. As such, parasitic capacitance as well as contact resistance is likewise reduced to thereby provide a more efficient operating IC.

Although the invention has been described in detail, one who is skilled in the art should understand that they can make various changes or substitutions herein without departing from the scope of the invention.

What is claimed is:

1. A method of fabricating a semiconductive device, comprising:
 depositing a hydrocarbon layer over a semiconductive substrate;
 patterning the hydrocarbon layer to define an interconnect structure;
 etching the patterned hydrocarbon layer to form openings in the hydrocarbon layer;
 depositing an interconnect structure within the openings of the hydrocarbon layer; and
 completely removing a remaining hydrocarbon layer by sublimation at about room temperature.

2. The method recited in claim 1, wherein completely removing comprises subjecting the hydrocarbon layer to a temperature between about 22° C. and about 30° C.

3. The method recited in claim 1, wherein the hydrocarbon layer comprises a cyclic compound.

4. The method recited in claim 3, wherein the cyclic compound is camphene, naphthalene, camphor, toluene, bromo-nitrobenzene, or combinations thereof.

5. The method recited in claim 1, wherein forming an interconnect comprises patterning the hydrocarbon layer to form interconnect openings therein and depositing a conductive material within the openings.

6. The method recited in claim 5, wherein patterning includes etching the hydrocarbon layer using a plasma etch or a wet etch process.

7. The method recited in claim 1, further including forming an interconnect support structure to provide support for the interconnect structure.

8. The method recited in claim 7, wherein the interconnect support structure is a support structure formed within openings in the hydrocarbon layer located adjacent the interconnect structure.

9. The method recited in claim 7, wherein the interconnect support structure comprises a support liner located between the hydrocarbon layer and the interconnect structure.

10. The method recited in claim 9, wherein the support structure further comprises a dielectric material located around the support liner.

11. The method recited in claim 1, further comprising doping the hydrocarbon layer to make the hydrocarbon layer photosensitive.

12. The method recited in claim 1, wherein removing includes increasing the sublimation rate by using high energy light.

13. The method recited in claim 1, wherein removing includes using chemical accelerator to increase the sublimation rate.

14. The method recited in claim 1 wherein the semiconductor device is an integrated circuit and the method further comprises:
   forming transistors over the semiconductive substrate;
   depositing the hydrocarbon layer over the transistors;
   forming the interconnect structures within the hydrocarbon layers, the interconnect structures electrically interconnecting the transistors to form an operative integrated circuit; and
   removing the hydrocarbon layers by sublimation.

15. A method of fabricating a semiconductive device, comprising:
   depositing a hydrocarbon layer over a semiconductive substrate, the hydrocarbon layer comprising at least one compound chosen from camphene, naphthalene, camphor, toluene, bromo-nitrobenze, poly(para-xylylenes), poly(N-phenyl-maleimide) and organic phase copolymers comprising parylene units;
   forming an interconnect structure within the hydrocarbon layer; and
   completely removing the hydrocarbon layer by sublimation at about room temperature.

16. The method as recited in claim 1, wherein depositing the hydrocarbon layer comprises sputter deposition at a temperature less than about 100° C.

* * * * *

UNITED STATES PATENT AND TRADEMARK OFFICE
CERTIFICATE OF CORRECTION

PATENT NO. : 7,601,629 B2 Page 1 of 1
APPLICATION NO. : 11/312926
DATED : October 13, 2009
INVENTOR(S) : Ramappa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 316 days.

Signed and Sealed this

Fifth Day of October, 2010

David J. Kappos
*Director of the United States Patent and Trademark Office*